United States Patent [19]

Mueller

[11] Patent Number: 5,140,003

[45] Date of Patent: Aug. 18, 1992

[54] METHOD FOR MANUFACTURING LAYERS FROM AN OXIDE-CERAMIC SUPERCONDUCTOR MATERIAL ON A SUBSTRATE USING A CVD-PROCESS

[75] Inventor: Alfred Mueller, Erlangen, Fed. Rep. of Germany

[73] Assignee: Siemens Aktiengesellschaft, Berlin & Munich, Fed. Rep. of Germany

[21] Appl. No.: 455,074

[22] Filed: Dec. 22, 1989

[30] Foreign Application Priority Data

Mar. 22, 1989 [DE] Fed. Rep. of Germany ....... 3909406

[51] Int. Cl.$^5$ .............................................. C23C 16/00
[52] U.S. Cl. .................................. 505/1; 427/255.3; 427/255.1; 427/62; 427/255.2; 505/734
[58] Field of Search ................. 505/1; 427/252, 255.1, 427/255.2, 255, 255.3

[56] References Cited

U.S. PATENT DOCUMENTS 4,501,602  2/1985  Miller et al. ..................... 427/255
4,558,144 12/1985  Fay et al. ......................... 427/252

FOREIGN PATENT DOCUMENTS 3734069  4/1989  Fed. Rep. of Germany .

OTHER PUBLICATIONS

A. D. Berry et al., Applied Physics Letters 52 (20) 16 May 1988, pp. 1743-1745.
J. Nakamori et al., Japanese Journal of Applied Phys., vol. 27, No. 7, Jul. 88, pp. L1265-L1267.
H. Yamane et al., Japanese Journal of Applied Phys., vol. 27, No. 7, Jul. 1988, L1275-L1276.
A. J. Panson et al., Applied Physics Letters 53 (18), 31 Oct. 1988, pp. 1756-1758.

*Primary Examiner*—Shrive Beck
*Assistant Examiner*—Benjamin L. Utech
*Attorney, Agent, or Firm*—Kenyon & Kenyon

[57] ABSTRACT

At least one layer from an oxide-ceramic superconductor material with a high transition temperature is produced on a substrate using a CVD-process. As parent materials, at least one vaporizable composition of each of the metallic components of the superconductor material is provided respectively, and these parent compositions are vaporized respectively at a predetermined temperature and with a predetermined partial pressure. In addition, at least one gaseous coreactant is provided, which is reactive with the parent compositions, the parent compositions as well as a minimum of one coreactant are dosed respectively by means of a carrier gas stream and united in a gas mixture with a predetermined mixture ratio, and to form the superconductor material, the conditions of reaction are adjusted using the energy supply for a reaction of or with the parent compositions and a minimum of one coreactant. A gaseous coreactant containing at least ammonia or organic amines is fed to the gas mixture. Gaseous water is advantageously admixed with this coreactant.

11 Claims, 2 Drawing Sheets

METHOD FOR MANUFACTURING LAYERS FROM AN OXIDE-CERAMIC SUPERCONDUCTOR MATERIAL ON A SUBSTRATE USING A CVD-PROCESS

BACKGROUND OF THE INVENTION

The present invention relates to a method for manufacturing a layer from an oxide ceramic superconductor material with a high transition temperature of a substance system containing metallic components and oxygen on a substrate by means of a chemical vapor deposition (CVD) process.

A method for depositing at least one layer from an oxide-ceramic superconductor material of a substance system with a high transition temperature containing metallic components and oxygen on a substrate is the subject matter of German Patent Application P 37 34 069.7 filed Oct. 8, 1987. The following process steps are thereby provided:

1) As parent materials, one provides respectively at least one vaporizable composition of each of the metallic components of the substance system, 2) each of these parent compositions is vaporized at a predetermined temperature and with a predetermined partial pressure and quantitatively regulated [dosed] by means of a carrier gas stream, so that the thus formed gas streams are subsequently united in a gas mixture, whereby one adjusts a metallic component ratio as needed to form the superconductor material, 3) to deposit the desired superconductor material, the conditions of reaction are adjusted using the energy supply for a reaction of or with the evaporated parent compositions.

According to a preferred specific embodiment of this method, at least one additional gaseous coreactant is directed to the gas mixture from the gas streams containing the parent composition, by means of a carrier gas, which can react with the evaporated parent compositions while forming the superconductor material. Superconductive metal oxide compositions are known which are based on a substance system containing metallic components and oxygen. They are distinguished by such high transition temperatures $T_c$, that cooling is possible with liquid nitrogen of approximately 77 K at standard pressure. Y-Ba-Cu-O, Bi-Sr-Ca-Cu-O and Tl-Ba-Ca-Cu-O in particular are appropriate substance systems. Thin coatings or films from these materials can often be manufactured using special PVD (physical vapor distribution) processes such as, for example, coating by evaporation or sputtering. Moreover, experiments have already been carried out where coatings from these materials are deposited on to substrates by means of special CVD processes as well. Included among these is the process described in the patent application mentioned above.

According to this proposed method, as parent materials, at least one vaporizable composition of each of the metallic components of the substrate system is provided respectively. Chelate, preferably $\beta$-diketonate, is especially suited for use as a parent composition of the metallic components. Each of these three parent compositions is then vaporized at a predetermined temperature and a predetermined partial pressure. The thus formed gas streams are then quantitatively regulated by means of a special carrier gas stream, for example of argon, and united into a gas mixture, so that one obtains the metallic component ratio which is needed to form the superconductor material. At least one additional gaseous coreactant, which can react with the evaporated parent compositions thereby forming the superconductor material, can be directed by means of a carrier gas stream to the gas mixture. For this purpose, vaporized (gaseous) water or oxygen gas are proposed as especially suited coreactants. To deposit the desired superconductor material, the conditions of reaction are finally adjusted through the energy supply for a reaction of or with the gaseous parent compositions and the coreactant. The energy supply can be provided in particular by increasing temperature. The deposition of the superconductor material can take place thereby in a reaction of or with the parent compositions and the coreactant, as a result of the hydrolysis of the parent compositions and dehydration of the thereby recovered hydroxide, or also as a result of the oxidation of the parent compositions.

SUMMARY OF THE INVENTION

It is an object of the present invention to provide a material on a substrate using a CVD process method for manufacturing a layer from an oxide ceramic superconductor so that at least a temporary reduction of the reaction temperature is attained as well as an increase of the reaction rate.

The above and other objects of the invention are achieved by a method for manufacturing at least one layer from an oxide-ceramic superconductor material with a high transition temperature of a substance system containing metallic components and oxygen on a substrate by means of a CVD-process, comprising the steps of:

providing as parent materials at least one vaporizable composition of each of the metallic components of the substance system;

vaporizing each of the parent compositions at a predetermined temperature and with a predetermined partial pressure;

providing in addition, at least one gaseous coreactant which is reactive with the vaporized parent compositions;

dosing, respectively, the vaporized parent compositions, and at least one gaseous coreactant by means of a carrier gas stream, so that when the thus formed gas streams are subsequently united in a gas mixture, a metallic component ratio is adjusted, which is adapted to the composition of the superconductor material; and to form the desired superconductor material, adjusting the conditions of reaction using the energy supply for a reaction of or with the vaporized parent compositions and the at least as one coreactant, and feeding to the gas mixture the gaseous coreactant a coreactant at least containing ammonia or an organic amine.

The advantages associated with this refinement of the process can particularly be seen in that a hydrolytic reaction is promoted to form the superconductor material; in other words it is made possible at a relatively low temperature and with a relatively high reaction rate. Organic amines show a corresponding effect as well, especially when the diketonates of the metallic parent components are also hydrolyzed.

BRIEF DESCRIPTION OF THE DRAWINGS

The invention will be described in greater detail in the following detailed description with reference to the drawings, in which.

DETAILED DESCRIPTION

Figure 1:
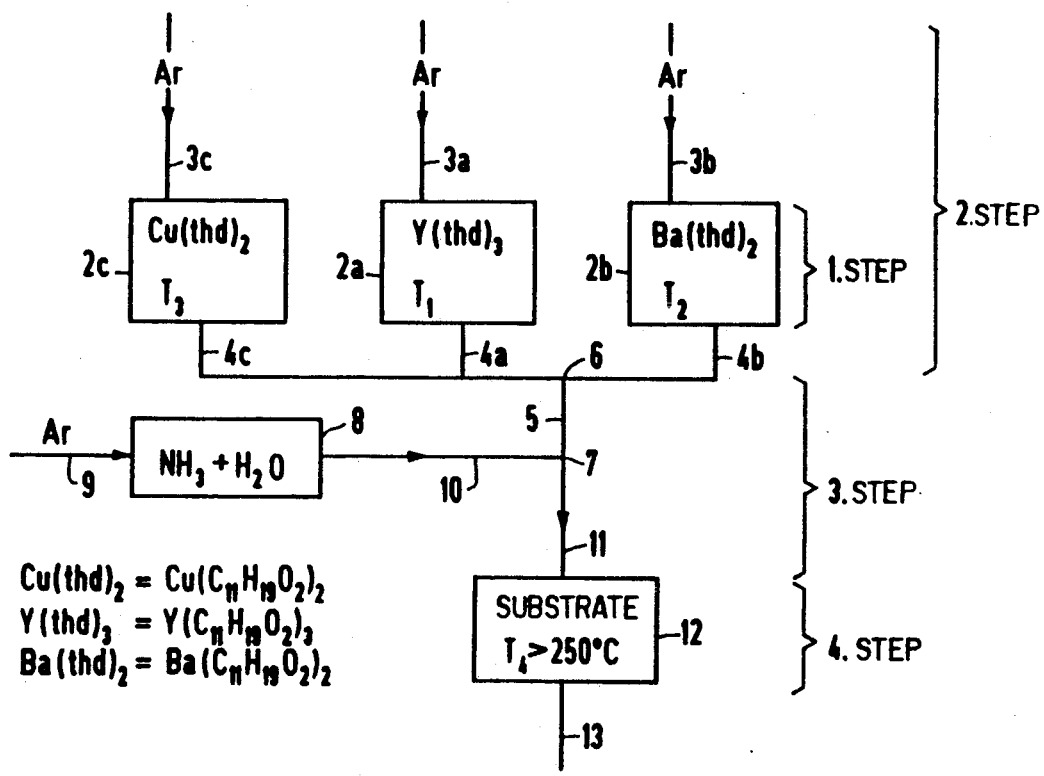
FIG. 1 shows schematically the functional sequence for a coating process according to the invention, where substrates of considerable length are coated with a special superconductive oxide-ceramic.

In the case of the process according to the invention, one starts out with the disclosure of the mentioned German Patent Application P 37 34 069.7. With the process, single or multilayer coatings with layer thicknesses up to over 10 $\mu$m from known superconductive high-$T_c$ materials (with transition temperatures $T_c$ over 77 K) are to be deposited using chemical methods on substrates (carrier bodies) of any shape. As an exemplified embodiment, the manufacturing of a coating from the known superconductive high-$T_c$ material $YBa_2Cu_3O_{7-x}$ (with $0 < x < 0.5$) is taken as a basis. This material is to be classed with the four-component substance system Me1-Me2-Cu-O, whereby the metallic component Me1 generally contains at least one element from the group of rare-earth elements [metals](including Y) and the metallic component Me2 generally contains at least one element from the group of alkaline-earth metals.

According to an advantageous refinement, the process of the invention is essentially subdivided into four process steps. They shall be explained in detail in the following based on the exemplified embodiment.

1. Process Step

(Preparing Vaporizable Parent Components)

Since all in all the three metallic components Y, Ba and Cu of the desired superconductive material are only able to be vaporized with difficulty within the framework of the Y-Ba-Cu-O system, vaporizable compositions of these elements are provided as parent materials. Of the organic compositions of parent metals, $\beta$-diketone-chelate is particularly suited for this purpose. The copper-chelate $Cu(C_5H_7O_2)_2$ and $Cu(C_{11}H_{19}O_2)_2$ as well as the Y- and Ba-chelate $Y(C_{11}H_{19}O_2)_3$ or $Ba(C_{11}H_{19}O_2)_2$ of the 2.2.6.6-tetramethyl-heptane-3.5-dion are particularly to be applied for the process according to the invention. The chelates can either be obtained commercially or manufactured using a generally known method from $\beta$-diketones, acetylacetone or tetramethyl-heptane-dion, and from the metallic salts.

2. Process Step

(Vaporization and Dosing)

In this process step, the three parent compositions of the three metallic parent elements Y, Ba and Cu selected according to the first process step are each vaporized as parent materials in a separate evaporator [flash] chamber respectively at a predetermined temperature $T_1$ or $T_2$ or $T_3$ respectively. The temperatures to be selected depend thereby on the required partial pressures of the parent compositions which are used. According to the diagrammatic representation shown in FIG. 1 for a deposition according to the invention of a superconductive high-$T_c$ oxide-ceramic of the substance system Y-Ba-Cu-O by means of a chemical gas-phase reaction, the vapors (gases) of the three parent compositions in the evaporator [flash] chambers 2a to 2c are admixed respectively with a carrier gas stream 3a to 3c of argon, for example. These admixtures must be dosed so that when the thus formed gas streams 4a to 4c are subsequently united in a gas mixture 5 in a mixing area 6, for example, in an appropriate mixing chamber, a specific proportion of the three metallic parent elements is observed at least approximately. This proportion depends on the degree of conversion of the parent elements in the case of a subsequent reaction while the desired superconductor material is formed and deposited. In the case of a complete conversion, this proportion can more or less correspond to the stoichiometric proportion of the parent elements in the superconductor material. This dosing is crucial in the case of the process according to the invention which involves several components, whose properties depend critically on the proportional composition. Therefore, for the second process step it is imperative that the vapor pressure of the applied parent compositions be considered as a function of the temperature. The corresponding data are either known or can be easily determined experimentally. The vapor-pressure curves p for $\beta$-diketonate of Y, Ba and Cu are represented in a diagram in FIG. 2, whereby the reciprocal value of the temperature is plotted on the lower abscissa as 1/T. The corresponding T-values (in ° C.) can be obtained based on the upper abscissa. Thus, for $(C_5H_7O_2)_2$, for example, in the presence of Argon, a pressure p of 1 torr at approximately 186° C. and a pressure p of 10 torr at approximately 225° C. are determined.

According to the assumed exemplified embodiment, the argon is guided by way of a gas meter through a glass tube heated with a constant temperature zone, which contains a loose packing of the substance to be vaporized from a diketonate-quartz-wool mixture. One can, for example, adjust temperatures $T_1$ to $T_3$ in the evaporator vessels where the partial pressures of the components to be taken from the vapor pressure temperature curves are identical. These temperatures lie for example in a temperature range of between 150° C. and 300° C.. For a molar ratio of the diketonates of Y, Ba and Cu in the reaction mixture 11 of 1:2:3, carrier gas streams with flows are then provided in the same proportion 1:2:3, measured in 1/sec/ (liters per seconds).

3. Process Step

(Complement with a Reactive Component)

Figure 2:
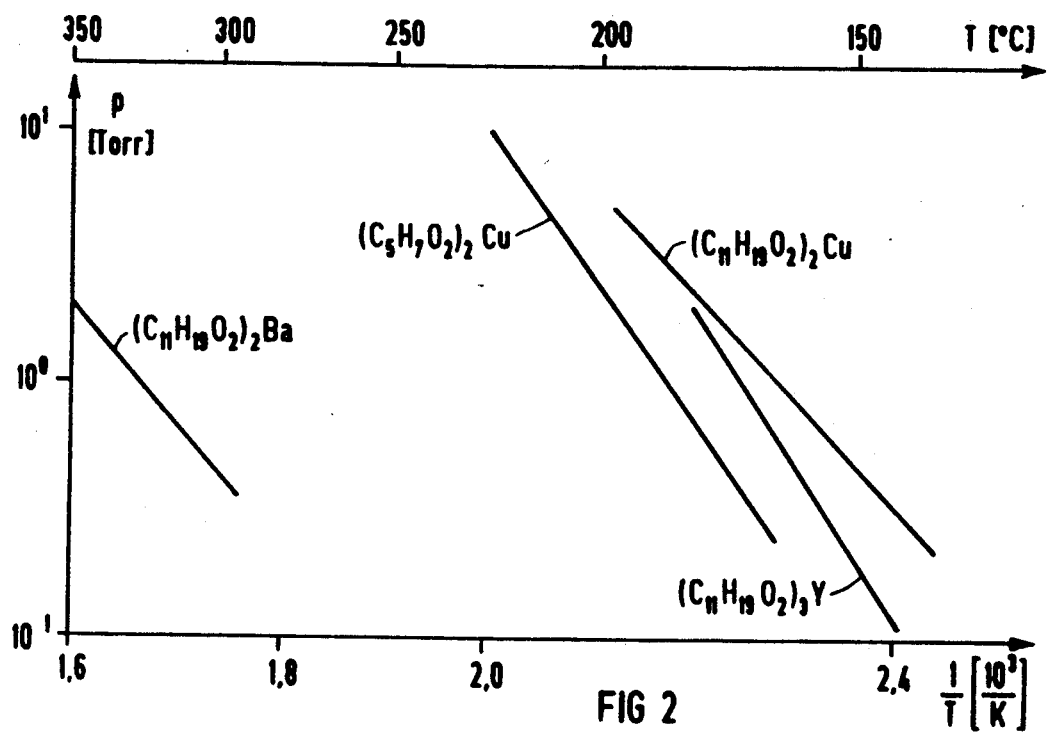
FIGS. 2 and 3 respectively show vapor-pressure temperature curves and conversion [reaction] temperature curves of individual parent components for the process according to the invention.
Figure 3:
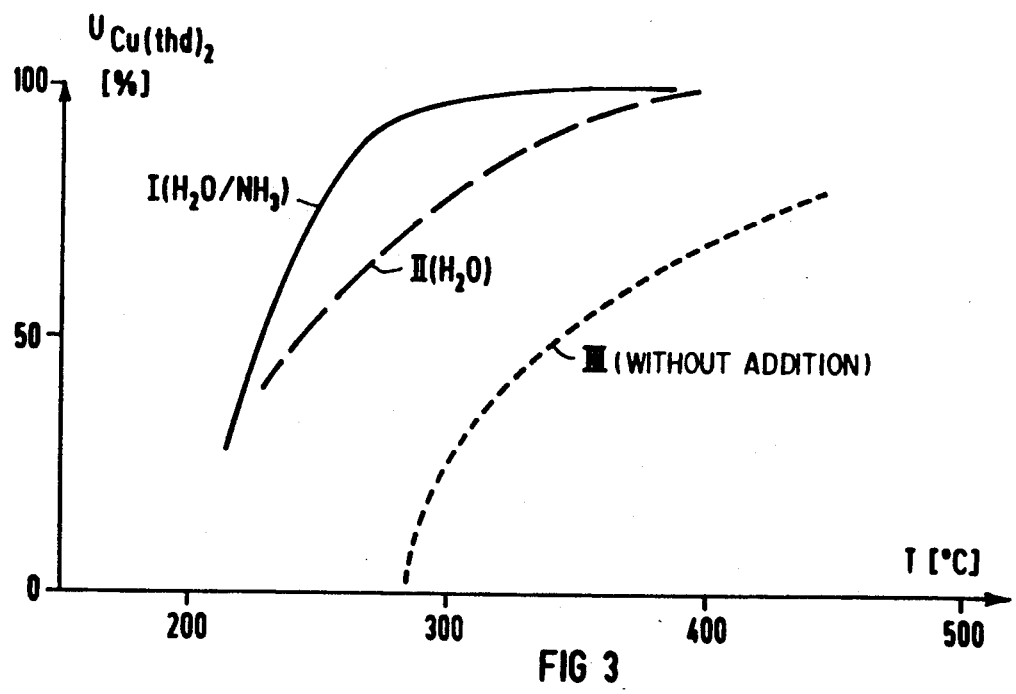

According to the reaction diagram shown in FIG. 1, in the third process step, at least one further gaseous component is admixed in the mixing area 6, for example, or also particularly in an area 7 arranged downstream from this mixing area 6. This minimum of one component is thereby selected so as to allow a conversion with the vaporized parent composition during the formation or deposition of the desired superconductive high-$T_c$ oxide-ceramic under special energy supply conditions. According to the invention, for example, at least one gaseous organic amine can be provided. Ammonia ($NH_3$)-gas is also particularly suited. One can advantageously admix water ($H_2O$) in a gaseous state with this ammonia ($NH_3$) gas, as is assumed in the case of the exemplified embodiment. From the diagram of FIG. 3, the degree of conversion U (in %) for this coreactant, for example of $Cu(C_{11}H_{19}O_2)_2$, is apparent as a function of the temperature. In addition to the corresponding curve I for this coreactant, two further curves II and III are plotted. These curves result in cases where pure water gas is provided as a coreactant (curve II), that is to say, in general one does without a special coreactant (curve III). As one can conclude from the diagram of the figure the coreactant provided according to the invention results advantageously, when there is a relatively low reaction temperature, in an almost complete conversion being attained with the Cu-chelate. A corresponding factual situation also results for the chelate of the other metallic components of the selected substance system.

The coreactant provided according to the invention of gaseous $H_2O/NH_3$ is added in a chamber 8—likewise dosed—to a carrier gas stream 9, such as for example, of argon. The thus created gas mixture is designated in the following as "reaction component" 10. This reaction component should be mixed with the gas mixture 5, for example in area 7, under admixture conditions, where there is no more significant reaction with the vaporized parent compositions. Thus a reaction gas mixture results, which is designated with 11 in FIG. 1. According to the selected exemplified embodiment, this reaction gas mixture is composed of the vaporized diketonates of the metallic parent elements Y, Ba and Cu, the $H_2O/NH_3$-gas mixture of the reaction components, as well as of the carrier gas Ar. In any case, the concentration values of the diketonate in the reaction gas mixture 11, which determine the composition of the superconductive high-$T_c$ oxide-ceramic to be deposited, are adjusted, also in the case of an only partially, but reproducible conversion, by way of the partial pressure with a defined temperature and controlled carrier gas stream.

4. Process Step (Chemical Gas Phase Reaction)

According to FIG. 1, the reaction gas mixture 11 is finally directed into a reaction chamber 12, where a substrate to be coated is found. This substrate can be permanently arranged in the reaction chamber 12, for example, or especially in the case of an uninterrupted coating of, for example, band-shaped or tubular substrates, it can be continuously guided through this reaction chamber. Conditions of reaction are thereby fulfilled in the reaction chamber, which ensure the desired conversion to the superconductive high-$T_c$ oxide-ceramic on the substrate. This conversion can be achieved through a single-stage energy input, especially through appropriate temperature conditions. Then, with these temperature conditions, the vaporized parent compositions and the gaseous coreactant are converted in a process during the formation of the desired superconductor material. Moreover, a multi-stage energy input is also possible. According to this path, the vaporized parent compositions and the gaseous coreactant are first converted into oxides of the metallic components of the superconductor material. A further stage follows this, in which these oxides of the metallic components are converted to the desired superconductor material with the appropriate energy input. In the last case, for the additional stage, one advantageously selects a higher temperature than for the first stage. According to the selected exemplified embodiment of FIG. 1, a single-stage process is assumed. For this purpose, the substrate is advantageously brought to a predetermined temperature $T_4$. Provided that the reaction is initiated by an increase in temperature, the lower limit for $T_4$ can advantageously lie at approximately 250° C.

A hydrolysis and dehydration in the presence of ammonia ($NH_3$) or a gaseous amine are especially beneficial for the preparation of the superconductive oxide-ceramic or of the basic oxides of the mentioned substance system within the reaction chamber 12. That is to say, $NH_3$ or amine advantageously influence the rate of the hydrolytic reaction, without being consumed in the process. The quasi-catalytic effect of $NH_3$ or amine can be described according to the following reaction diagram:

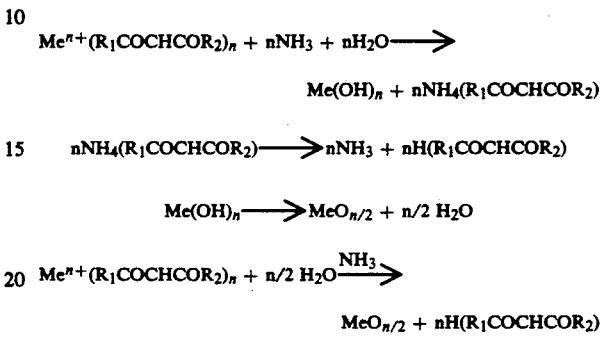

Thereby, Me are the metallic parent components Me1, Me2 and Cu of the substance system. $R_1$ and $R_2$ are known hydrocarbon residues Furthermore, the waste gas which forms during the above reaction and is to be exhausted from the reaction chamber 12 is designated with 13 in FIG. 1.

Deviating from the represented exemplified embodiment, a combined reaction can also be provided possibly, in which a hydrolysis and oxidation take place at the same time. Such a combined reaction is particularly required, when the oxygen stoichiometry of the superconductive high-$T_c$ phase to be produced of the selected substance system cannot be attained otherwise. In such a case, for example, during the third process step, in addition to the $H_2O/NH_3$ mixture, $O_2$ would also be supplied to the gas mixture 5 from the diketonates of the metallic parent components and argon in area 7 to complete the process. In addition, it is also possible to feed $O_2$ into the reaction chamber 12 or to have an $O_2$-atmosphere in this chamber.

It is possible that one is not even able to mix the coreactant 10 outside of the reaction chamber 12 in the area 7; rather one is able to introduce the reaction components such as $H_2O$ and $NH_3$ as well as possibly $O_2$ by means of a carrier gas stream directly into the reaction chamber.

Besides providing the mentioned temperature increase as an energy input to initiate the desired reaction to form or deposit the superconductor material in the reaction chamber 12 on a substrate, other known energy input methods, such as using a laser, are just as well suited for the method according to the invention.

According to the exemplified embodiment selected for the process diagram of FIG. 1, one starts out with the assumption that the superconductor material to be produced is classed with the four-component substance system Me1-Me2-Cu-O. The process according to the invention, however, is just as well suited for other oxide-ceramic superconductor materials with a high transition temperature, provided that their parent components are able to be converted to the desired material by hydrolyzing vaporizable parent compositions together with the additional gaseous coreactant.

Moreover, as already mentioned, besides $NH_3$, gaseous, organic amines are just as well suited as the coreactant 10 for the process according to the invention. In this connection, compositions are concerned which can be derived from NH$_3$. At least one of its H-atoms are replaced with hydrocarbon residues, as is generally known. A corresponding exemplified embodiment would be, for example, dimethylamine (CH$_3$* NH * CH$_3$).

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A method for manufacturing at least one layer from an oxide-ceramic superconductor material on a substrate by means of a CVD-process, said superconductor material containing a crystalline superconducting phase with a transition temperature of at least 77 K and comprising a substance system containing metallic components and oxygen, said CVD-process comprising the steps of:
   providing as parent materials, at least one vaporizable composition of each of the metallic components of the substance system respectively,
   vaporizing each of the parent compositions at a predetermined temperature and with a predetermined partial pressure,
   providing in addition, at least one gaseous coreactant which is reactive with the vaporized parent compositions,
   dosing the vaporized parent compositions and the at least one gaseous coreactant with respective carrier gas streams, so that when the thus formed gas streams are subsequently united in a gas mixture, a metallic component ratio is adjusted, which is adapted to the composition of the superconductive phase, and
   to from the desired superconducting phase via a hydrolytic reaction, adjusting the conditions of reaction using an energy supply for a reaction of or with the vaporized parent compositions and the at least one coreactant, and feeding to the gas mixture as the coreactant a gaseous coreactant containing at least one of ammonia and an organic amine, said ammonia or amine being a catalyst for the hydrolytic reaction.

2. The method recited in claim 1, wherein the reaction takes place while oxygen is being supplied.

3. The method according to claim 1, further comprising admixing gaseous water with the coreactant.

4. The method recited in claim 1, further comprising admixing oxygen gas with the coreactant.

5. The method recited in claim 1, wherein the step of providing as parent materials comprises providing chelates as parent compositions for the metallic components.

6. The method recited in claim 1, further comprising providing argon as the carrier gas.

7. The method recited in claim 1, wherein the reaction of or with the parent components is initiated by means of a temperature increase.

8. The method recited in claim 1, further comprising providing the energy supply in a single stage, whereby the vaporized parent compositions and the coreactant are converted directly while the superconducting phase is formed.

9. The method recited in claim 1, further comprising providing the energy supply in several stages, whereby in a first stage, the vaporized parent compositions and the coreactant are converted into basic oxides of the metallic components of the substance system and then in a further stage, these oxides of the metallic components are converted while the superconducting phase is formed.

10. The method recited in claim 9, wherein, in the further stage, a higher temperature is provided than for the first stage.

11. The method recited in claim 5, wherein the step of providing as parent materials comprises providing $\beta$-diketones.

* * * * *